United States Patent
Okubo et al.

(10) Patent No.: US 7,592,256 B2
(45) Date of Patent: Sep. 22, 2009

(54) METHOD OF FORMING TUNGSTEN FILM

(75) Inventors: Kazuya Okubo, Tokyo (JP); Mitsuhiro Tachibana, Yamanashi (JP); Cheng Fang, Yamanashi (JP); Kohichi Sato, Yamanashi (JP); Hotaka Ishizuka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 488 days.

(21) Appl. No.: 10/486,794

(22) PCT Filed: Aug. 7, 2002

(86) PCT No.: PCT/JP02/08086

§ 371 (c)(1),
(2), (4) Date: Jul. 23, 2004

(87) PCT Pub. No.: WO03/016588

PCT Pub. Date: Feb. 27, 2003

(65) Prior Publication Data

US 2005/0032364 A1 Feb. 10, 2005

(30) Foreign Application Priority Data

Aug. 14, 2001 (JP) ............................. 2001-246089
Oct. 15, 2001 (JP) ............................. 2001-317175

(51) Int. Cl.
*H01L 21/44* (2006.01)

(52) U.S. Cl. ............... 438/685; 438/680; 257/E21.159; 257/E21.2

(58) Field of Classification Search ................ 438/680, 438/685, FOR. 405, 637, 638; 257/E21.579, 257/E21.159, E21.2

See application file for complete search history.

(56) References Cited

U.S. PATENT DOCUMENTS

| | | | |
|---|---|---|---|
| 5,306,666 A | 4/1994 | Izumi | |
| 5,534,072 A * | 7/1996 | Mizuno et al. | 118/728 |
| 5,599,739 A * | 2/1997 | Merchant et al. | 438/628 |
| 6,265,312 B1 * | 7/2001 | Sidhwa et al. | 438/685 |

(Continued)

FOREIGN PATENT DOCUMENTS

JP 7-94425 4/1995

OTHER PUBLICATIONS

J. W. Klaus, et al. Atomic layer deposition of tungsten using sequential surface chemistry with a sacrifical stripping reaction, Thin Solid Films, vol. 360, pp. 145-153, Feb. 1, 2000.

(Continued)

*Primary Examiner*—Michelle Estrada
(74) *Attorney, Agent, or Firm*—Oblon, Spivak, McClelland, Maier & Neustadt, P.C.

(57) ABSTRACT

A method of forming a tungsten film on a surface of an object to be processed in a vessel capable of being vacuumized, includes the steps of forming a tungsten film by alternately repeating a reduction gas supplying process for supplying a reduction gas and a tungsten gas supplying process for supplying a tungsten-containing gas with an intervening purge process therebetween for supplying an inert gas while vacuumizing the vessel. A reduction gas supplying period of a reduction gas supplying process among the repeated reduction gas supplying processes is set to be longer than that of the remaining reduction gas supplying processes.

32 Claims, 16 Drawing Sheets

U.S. PATENT DOCUMENTS

| | | | |
|---|---|---|---|
| 6,271,129 B1 * | 8/2001 | Ghanayem et al. | 438/675 |
| 6,309,966 B1 * | 10/2001 | Govindarajan et al. | 438/656 |
| 6,489,239 B1 * | 12/2002 | Jang et al. | 438/680 |
| 6,641,867 B1 * | 11/2003 | Hsu et al. | 427/255.392 |
| 6,660,330 B2 * | 12/2003 | Locke et al. | 427/250 |
| 2004/0224501 A1 * | 11/2004 | Lo et al. | 438/672 |

OTHER PUBLICATIONS

J. W. Elam, et al. "Nucleation and growth during tungsten atomic layer deposition on $SiO_2$ surfaces", Thin Solid Films, vol. 386, pp. 41-52, May 1, 2001.

J. W. Elam, et al. "Kinetics of the $WF_6$ and $SI_2H_6$ surface reactions during tungsten atomic layer deposition", Surface Science, vol. 479, pp. 121-135, May 20, 2001.

* cited by examiner

20 HEAT TREATMENT DEVICE

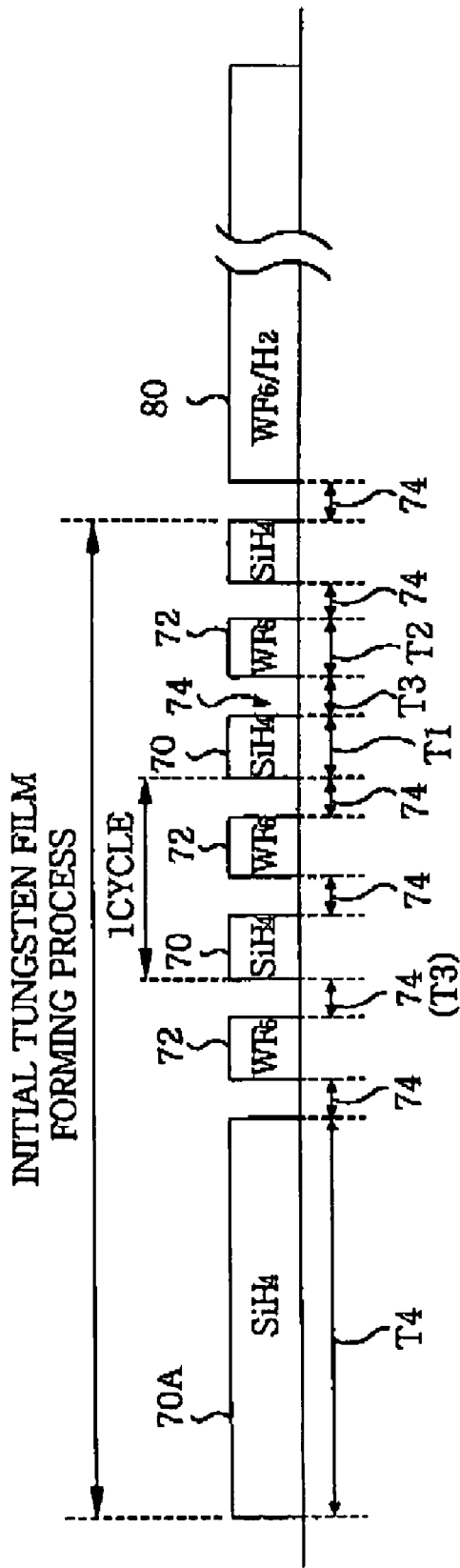

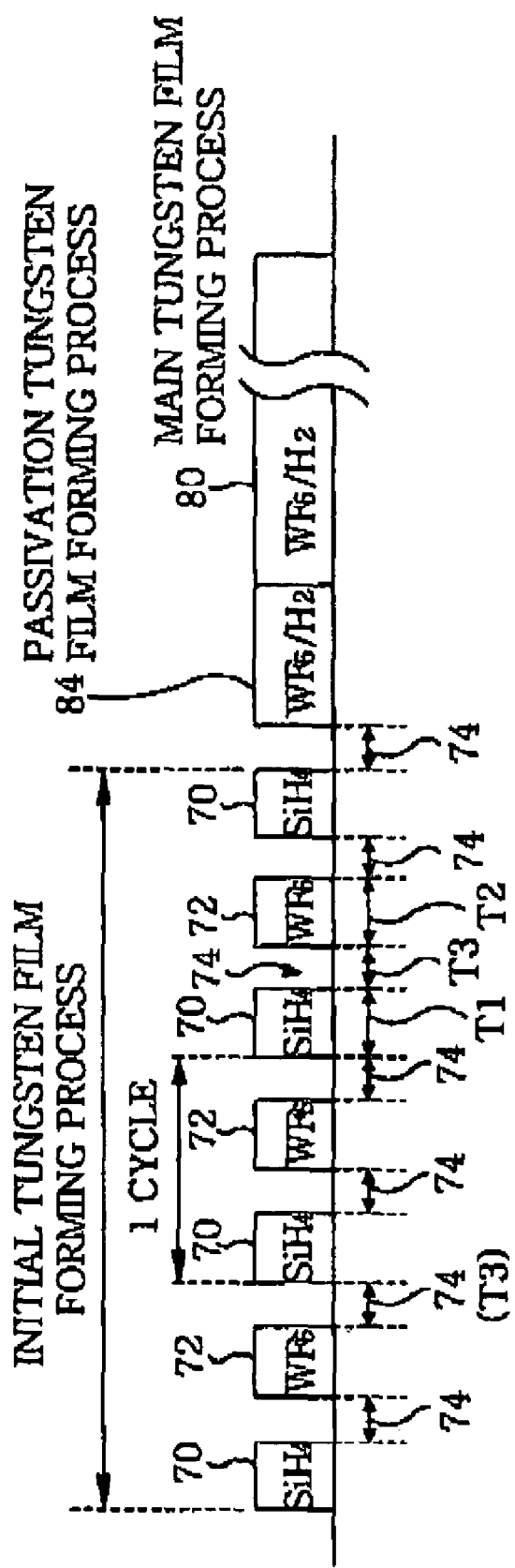

78 MAIN TUNGSTEN FILM

82 PASSIVATION TUNGSTEN FILM

METHOD OF FORMING TUNGSTEN FILM

FIELD OF THE INVENTION

The present invention relates to a method of forming a tungsten film on a surface of an object to be processed, e.g., a semiconductor wafer or the like.

BACKGROUND OF THE INVENTION

Generally, in order to form a wiring pattern on a surface of a semiconductor wafer serving as an object to be processed or bury recesses between wiring or contact holes during a semiconductor integrated circuit manufacturing process, a metal or a metalic compound such as W(tungsten), WSi(tungsten silicide), Ti(titanium), TiN(titanium nitride), TiSi(titanium silicide), Cu(copper) or $Ta_2O_5$(tantalum oxide) is deposited to form a thin film. In such a case, a tungsten film is widely uses since it has a small resistivity and requires a low film adhesion temperature. In order to form such a tungsten film, tungsten hexafluoride ($WF_6$) is used as a source gas and is reduced by hydrogen, silane, dichlorosilane or the like, thereby depositing the tungsten film.

In case of forming such a tungsten film, a Ti film, a TiN film, or a stack of both of those films is thinly and uniformly formed first on a wafer surface as a barrier layer serving as an under film for the purpose of improving the adhesivity and then suppressing a reaction with an underlying silicon layer and the tungsten film is deposited thereon.

When burying or remedying the recesses or the like, hydrogen gas having a weaker reducing power than silane is mainly used to enhance the burying characteristics. At this time, the barrier layer may be attacked by unreacted WFs to react with fluorine and then be expanded in volume, thereby generating an upwardly protruded volcano or a void in a buried hole.

The above phenomenon will be explained with reference to FIG. 13. FIG. 13 is a cross sectional view of a buried hole having a volcano and a void. A buried hole 2 such as a contact hole or the like is formed on a surface of a semiconductor wafer W. A barrier layer 4 formed of, e.g., a Ti/TiN film, is formed in advance on the surface including an inner surface of the buried hole 2. In case of performing a burying process on the structure described above by depositing a tungsten film 6 by way of simultaneously supplying $WF_6$ gas and $H_2$ gas, fluorine of the $WF_6$ gas is diffused into the barrier layer 4. Especially, the fluorine reacts with Ti in the barrier layer 4 on the inner surface, leading to a protruded deposition of the tungsten film 6 starting at the buried hole 2. As a result, a volcano 8 can be generated at an end portion of the protrusion by a stress of the tungsten film 6 or a void 10 having a cavity shape can also be generated inside the buried hole 2.

In order to prevent the generation of the volcano 8 or the like, silane having a stronger reducing power than that of the hydrogen gas was also used for forming a nucleation layer of the tungsten film 6 with a small thickness of, e.g., about 300 to 500 Å. Thereafter, deposition of a main tungsten film was carried out starting at the nucleation layer by using $H_2$ gas and $WF_6$ gas. In this case, however, the nucleation layer may not be Uniformly formed due to, e.g., a contamination of a surface of the barrier layer 4 serving as a base film.

Thus, prior to the formation of the nucleation layer, only silane is provided for a certain time period to allow reaction intermediates of the silane (SiHx:x<4) to be absorbed on a wafer surface at a low temperature, e.g., 400° C. at which a part of the silane can be decomposed. Then, the nucleation layer is grown starting at that portion. FIGS. 14A to 14F illustrate the processes for charging a buried hole with tungsten by using the above-described method.

As shown in FIG. 14A, an initiation process of adhering reaction intermediates 12, i.e., SiHx discussed above, on a surface of a wafer W is performed on the wafer W having a barrier layer 4 formed on its entire surface including an inner surface of a buried hole 2 (FIGS. 14A and 14B). Next, as described above, by simultaneously supplying the $WF_6$ gas and the $SiH_4$ gas for a certain time period as illustrated in FIG. 14C, a tungsten film is deposited starting at the reaction intermediates 12, thereby forming a nucleation layer 14 (FIG. 14D).

Subsequently, by simultaneously supplying the $WF_6$ gas and the $H_2$ gas as shown in FIG. 14E, a main tungsten film 16 is deposited so as to fill the buried hole as illustrated in FIG. 14F.

In case of forming the barrier layer 4 formed on the wafer surface, an organic compound source of Ti is normally used in order to increase a step coverage. However, a carbon component in the organic compound source is included in the barrier layer 4 and, thus, adhesion of the reaction intermediates to the barrier layer 4 becomes irregular despite the initiation process due to the exposure of the carbon component on a surface of the barrier layer 4. Consequently, the nucleation layer 14 is irregularly formed thereon, and the step coverage thereof is also deteriorated, resulting in deteriorated burying characteristics of a main tungsten film, causing voids, volcanoes or the like.

Such a problem does not occur in a case where the ratio between the thickness of the nucleation layer 14 and that of the entire tungsten film including the main tungsten layer 16 is not so high. On the other hand, in case the ration becomes non-negligibly high because of scaling down, voids of a non-negligible size can be generated due to a deterioration of the step coverage of the nucleation layer 14.

The above problem becomes aggravated as a serious issue especially when an inner diameter of a buried hole becomes smaller than or same to, e.g., 0.2 μm as a result of the manufacturing requirement for a further scaling down and a thinner film.

SUMMARY OF THE INVENTION

It is, therefore, a primary object of the present invention to provide a method of forming a tungsten film of satisfactory burying characteristics by preventing the generation of voids and volcanoes as large as adversely affecting the characteristics, even in a buried hole having a small diameter.

In accordance with a preferred embodiment of the present invention, there is provided a method of forming a tungsten film on a surface of an object to be processed in a vacuum vessel, the method including the step of: forming an initial tungsten film by alternately repeating a reduction gas supplying process for supplying a reduction gas and a tungsten gas supplying process for supplying a tungsten-containing gas with an intervening purge process therebetween for supplying an inert gas while vacumizing the vessel.

Accordingly, an initial tungsten film having a uniform thickness can be formed as a nucleation layer. Therefore, when a main tungsten film is subsequently deposited thereon, it is possible to restrict the generation of voids or volcanoes in sizes capable of adversely affecting the burying characteristics, e.g., even in a buried hole having a small diameter.

In accordance with another preferred embodiment of the present invention, there is provided a method of forming a tungsten film on a surface of an object to be processed in a processing vessel capable of being vacuumized, the method including the step of: forming an initial tungsten film by, in repetition, supplying a reduction gas and a tungsten-containing gas with an intervening purge process therebetween for supplying an inert gas while vacuumizing the vessel, wherein the total pressure of the reduction gas, the tungsten-containing gas and the inert gas is controlled to be constant.

In accordance with the present invention, by controlling the total pressure of the reduction gas, the tungsten-containing gas and the inert gas throughout the step of forming the initial tungsten film, the temperature of a wafer (an object to be processed) and the amount of gas to be absorbed can be maintained regularly.

In the method of forming the tungsten film in accordance with the present invention, a parameter, which is obtained by multiplying a partial pressure of the reduction gas by the supplying time thereof in an initial reduction gas supplying process among the repeated reduction gas supplying processes, may be set to be greater than that in the subsequent reduction gas supplying processes.

In accordance with the present invention, by performing a substantially same function as the initiation process of the conventional method, a reaction intermediate may be adhered to a surface of an object to be processed so that the surface can be activated.

In accordance with still another preferred embodiment of the present invention, an initial tungsten film is formed by repeatedly supplying a reduction gas and a tungsten-containing gas with an intervening purge process for supplying an inert gas, while setting the supplying time of a reduction gas in an initial reduction gas supplying process among the repeated reduction gas supplying processes to be longer than that of the subsequent reduction gas supplying processes and controlling the total pressure of the reduction gas, the tungsten-containing gas, and the inert gas to be constant throughout the step of forming the initial tungsten film.

In accordance with the present invention, the initial reduction gas supplying process functions in a same way as in the initiation process of the conventional method, and a temperature of a wafer (an object to be processed) and the amount of gas to be absorbed thereon can be maintained regularly by controlling the total pressure of the reduction gas, the tungsten-containing gas and the inert gas.

In accordance with the method of the present invention, after the initial tungsten film is formed, a main tungsten film is formed by simultaneously supplying the tungsten-containing gas and the reduction gas.

In accordance with the present invention, it is possible to prevent the generation of voids or volcanoes having sizes capable of adversely affecting the burying characteristics even in a buried hole having a small diameter, thereby providing satisfactory burying characteristics.

In accordance with the method of the present invention, a process for forming a passivation tungsten film is performed between the initial tungsten film forming process and the main tungsten film forming process by simultaneously supplying the tungsten-containing gas and the reduction gas while setting the flow ratio of the tungsten-containing gas to be smaller than that supplied in the main tungsten film forming process.

In case the thickness of an initial tungsten film is thin, when the main tungsten film is formed, volcanoes may be generated by an attack of the $WF_6$ gas. However, in accordance with the present invention, by forming a passivation tungsten film functioning as a so-called passivation film, the initial tungsten film can be protected, thereby further improving the burying characteristics.

In accordance with the method of the present invention, the initial tungsten film forming process and the passivation tungsten film forming process are carried out in a substantially equal condition with respect to the process pressure and/or the process temperature.

In accordance with the method of the present invention, the main tungsten film forming process has at least either the process pressure or the process temperature substantially higher in comparison with the passivation tungsten film forming process.

In the method of the present invention, the tungsten-containing gas may be $WF_6$ gas or an organic tungsten source gas.

Further, in the method of the present invention, the reduction gas may be selected from the group consisting of $H_2$, silane ($SiH_4$), disilane ($Si_2H_6$), dichlororosilane ($SiH_2Cl_2$), diboran ($B_2H_6$) and phospine ($PH_3$)

Further, in the method of the present invention, the tungsten-containing gas may preferably be $WF_6$ gas, and the reduction gas may preferably be $SiH_4$ gas in the initial tungsten film forming process and $H_2$ gas in the passivation tungsten film forming process.

BRIEF DESCRIPTION OF THE DRAWINGS

The above and other objects and features of the present invention will become apparent from the following description of preferred embodiments, given in conjunction with the accompanying drawings, in which:

FIG. 2B illustrates a gas supply pattern obtained by increasing a parameter of an initial reduction gas supplying process in the gas supply pattern of FIG. 2A, the parameter being (the partial pressure of a reduction gas) (the supplying time) period;

FIG. 2D depicts a gas supply pattern wherein a passivation tungsten film forming process is intervened between an initial tungsten film forming process and a main tungsten film forming process in the gas supply pattern of FIG. 2A;

DETAILED DESCRIPTION OF THE PREFERRED EMBODIMENTS

Hereinafter, a preferred embodiment of a method of forming a tungsten film in accordance with the present invention will be described in detail with reference to the accompanying drawings.

Figure 1:
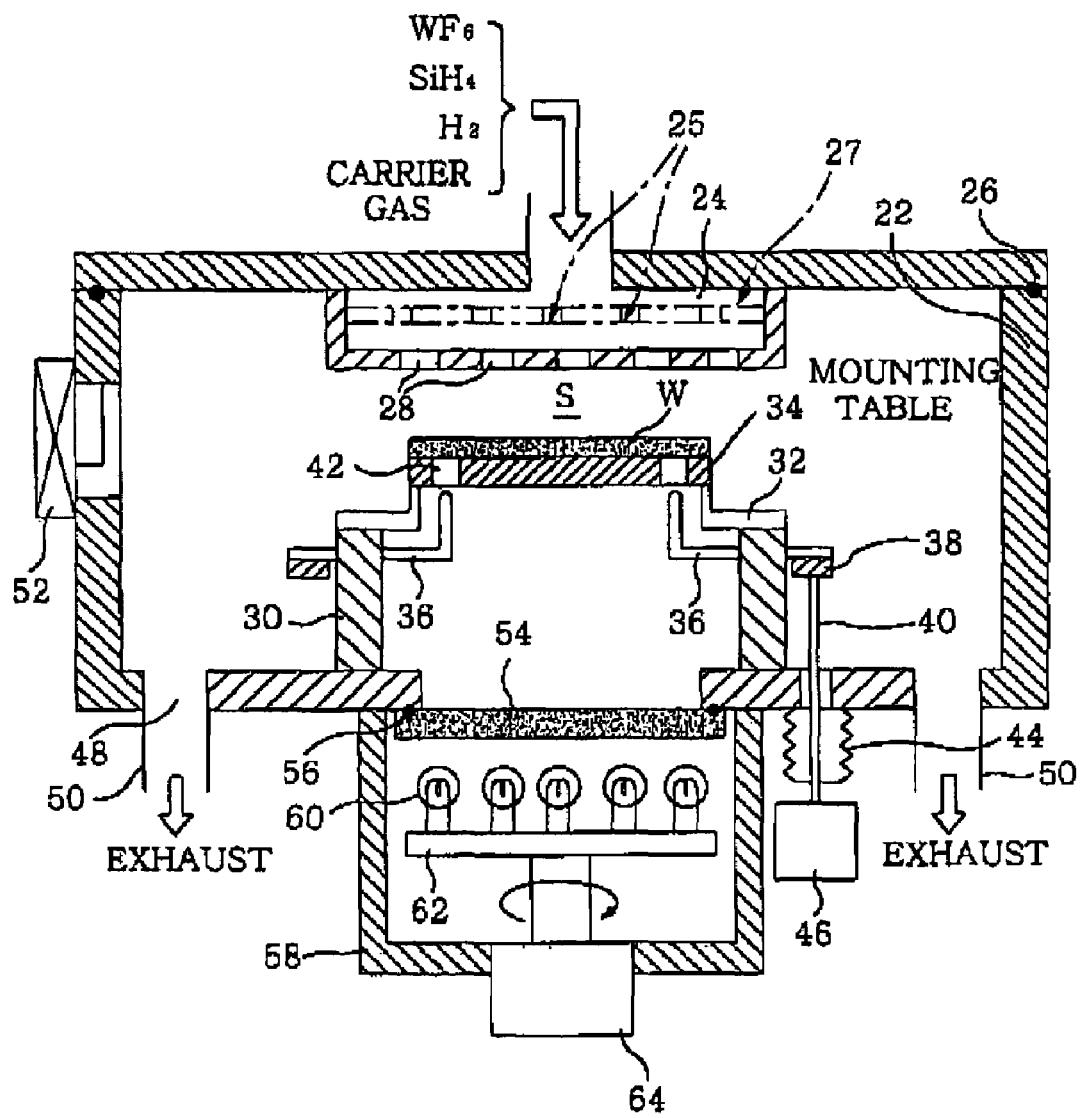
FIG. 1 is a cross sectional view of a heat treatment device for performing a method of forming a tungsten film in accordance with the present invention.
Figure 4:
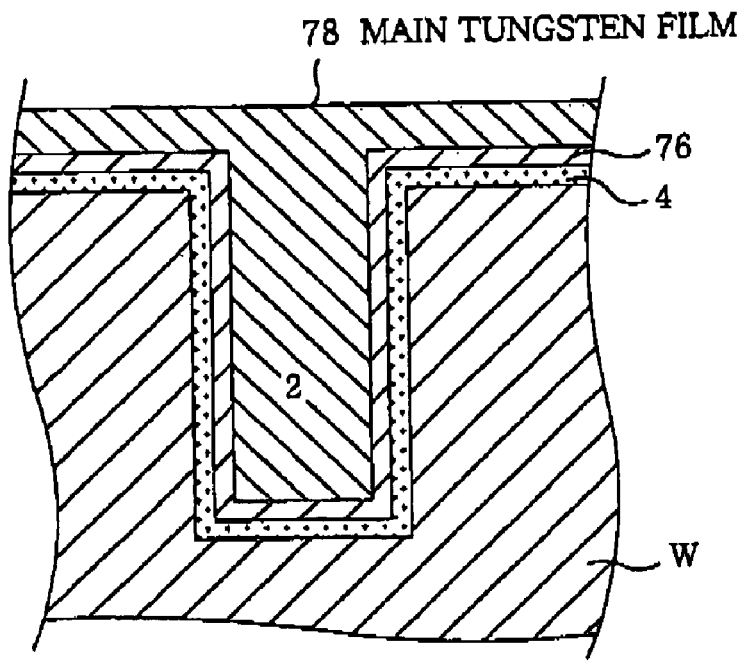
FIG. 4 provides an enlarged cross sectional view of an exemplary tungsten film deposited on a surface of a semiconductor wafer.
Figure 5:
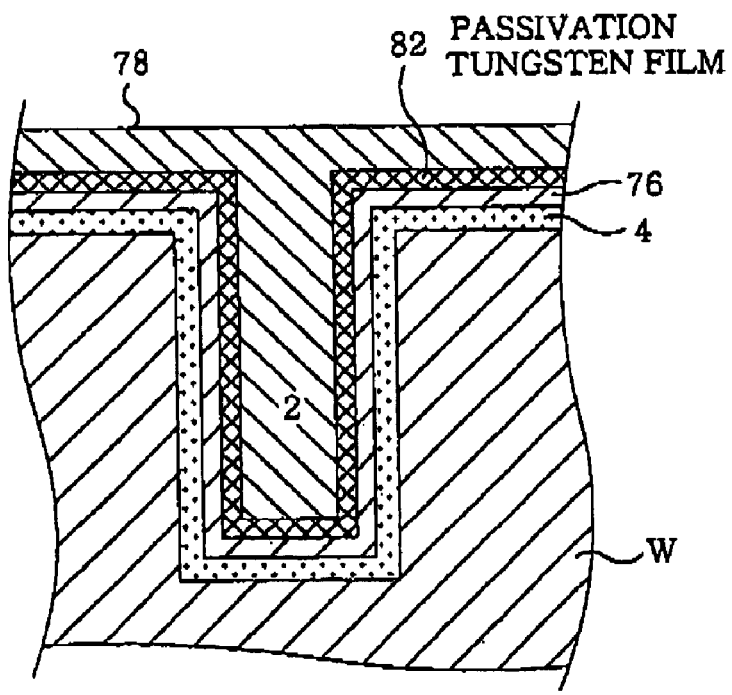
FIG. 5 offers an enlarged cross sectional view of another exemplary tungsten film deposited on a semiconductor wafer surface.

FIG. 1 is a cross sectional view of a heat treatment device for performing a method of forming a tungsten film in accordance with the present invention. FIGS. 2A to 2D provide supply patterns of each gas. FIG. 4 illustrates an enlarged cross sectional view of an exemplary tungsten film deposited on a semiconductor wafer surface. FIG. 5 presents an enlarged cross sectional view of another exemplary tungsten film deposited on a semiconductor wafer surface.

First of all, an explanation of a heat treatment device for performing the method of the present invention will be provided. The heat treatment device 20 has a processing vessel 22 having an approximately cylindrical cross-section, for example, which is made of aluminum. Installed on a ceiling portion of the processing vessel 22 is a shower head 24 for selectively introducing a flow rate controlled processing gas, e.g., various film forming gases, carrier gases and the like, via a sealing member 26 such as an O-ring and the like. Further, installed at a bottom portion of the shower head 24 is a plurality of gas jetting holes 28 for spraying a film forming gas toward a processing space S. Further, in the shower head 24, there may be installed one or more of diffusion plates 27 each having a plurality of diffusion holes 25 so as to facilitate a diffusion of a gas introduced therein.

Meanwhile, in the processing vessel 22, a mounting table 34 for loading thereon a semiconductor wafer W as an object to be processed is installed on a cylindrical reflector 30 built on a bottom portion of the processing vessel via, e.g., L-shaped three support members 32 (only two thereof are shown in FIG. 1).

Installed below the mounting table 34 are a plurality of, e.g., three L-shaped lifer pins 36 (only two thereof are illustrated in this example) rising upward. Base portions of the lifter pins 36 are commonly connected to a ring member 38 through vertical through holes (now shown) formed at the reflector 30. The ring member 38 is moved vertically by a drive up rod 40 passing through the bottom portion of the processing vessel, such that the lifter pins 36 can pass through lifter pin holes 42 formed through the mounting table 34, to thereby lift the wafer W.

An expansible/contractible bellows 44 is installed around the through hole for the drive up rod 40 formed at the bottom portion of the processing vessel 22, so that an inner space of the processing vessel 22 can be kept air-tight. Further, a bottom portion of the drive up rod 40 is connected to an actuator 46.

At a peripheral portion of the bottom portion of the processing vessel 22, an exhaust port 48 is formed to be connected to an exhaust passageway 50 being connected to a vacuum pump (not shown), so that it is possible to exhaust the inner space of the processing vessel 22 down to a predetermined vacuum level. Further, installed at a sidewall of the processing vessel 22 is a gate valve 52 to be opened and closed when a wafer is loaded thereinto or unloaded therefrom.

Although not illustrated, a vacuum gage (capamanometer) for measuring pressure is installed in the processing vessel 22, and an automatic pressure control valve for controlling pressure in the processing vessel 22 is installed at the exhaust passageway 50.

Further, air-tightly installed at the bottom portion of the processing vessel below the mounting table 34 is a transparent window 54 made of a heat ray transmission material, e.g., quartz or the like, via a sealing member 56 such as an O-ring or the like. Under the transparent window 54, a box-shaped heating chamber 58 is installed to surround the transparent window 54. The heating chamber 58 has therein a heating device, e.g., a plurality of heating lamps 60 disposed on a rotatable table 62 also serving as a reflector. The rotatable table 62 is revolved by a rotating motor 64 installed at a bottom portion of the heating chamber 58 via a rotation axis. Heat rays emitted from the heating lamps 60 transmit the transparent window 54 and then are irradiated on a bottom portion of the thin mounting table 34, thereby heating the bottom portion thereof and indirectly heating the wafer W on the mounting table 34. By using the heating lamps 60 in this way, it is possible to greatly increase a heating rate.

Figure 14A:
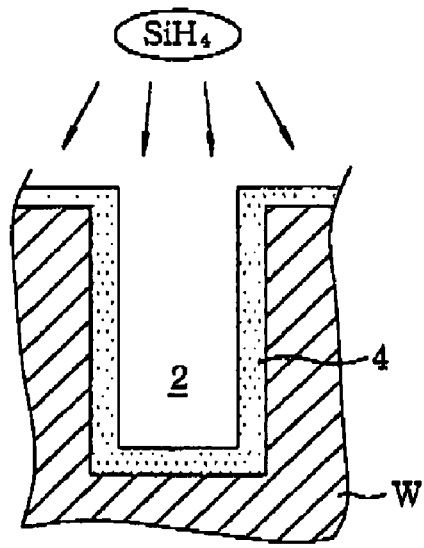
FIG. 14A provides an embodiment of a process for filling with tungsten a buried hole formed on the wafer w having a barrier layer formed on its entire surface including an inner surface of the buried hole.

Hereinafter, the method of the present invention, which is implemented by using the above-described device, will be described, First, the gate valve 52 installed at the sidewall of the processing vessel 22 is opened. Then, a wafer W is loaded into the processing vessel 22 by a transfer arm (not shown) and by lifting the lifter pins 36, the wafer W is transferred to the lifer pins 36. Next, the lifter pins 36 descend by lowering the drive up rod 40, so that the wafer W can be loaded on the mounting table 34. Provided as an under film on a surface of the wafer W including an inner surface of the buried hole 2 is a barrier layer 4, e.g., a Ti/TiN film formed during a previous process (see FIG. 14A).

Thereafter, predetermined amounts of film forming gas, carrier gas and the like serving as a processing gas is supplied from a processing gas source (not shown) to the shower head 24 and then substantially uniformly supplied into the processing vessel 22 through the gas jetting holes 28 according to a gas supply pattern, which will be described later. At the same time, an inner atmosphere of the processing vessel 22 is exhausted through the exhaust port 48, such that the interior of the processing vessel 22 can be kept at a predetermined pressure level. Further, each of the heating lamps 60 of the heating device disposed under the mounting table 34 is rotated so as to emit a heat energy.

The emitted heat source transmits the transparent window 54 and then is irradiated on a backside of the mounting table 34, thereby heating the backside thereof. The mounting table 34, as described above, has a very low thickness of, e.g., 1 mm and, therefore, is heated rapidly. Thus, the wafer loaded on the mountain table 34 can also be quickly heated to a predetermined temperature. The supplied film forming gas is subjected to a chemical reaction, resulting in a deposition of a tungsten thin film on an entire surface of the wafer W.

Hereinafter, supply patterns of each gas will be described in detail with reference to FIGS. 2A to 2D.

Referring to Figs, 2A to 2D, there are illustrated three types of gas supply patterns. In each of the patterns, a carrier gas, e.g., Ar gas or $N_2$ gas, is continuously supplied at a constant flow rate or a variable flow rate. Further, an inner space of the processing vessel 22 is continuously exhausted during a series of processes.

Herein, Was gas is used as a tungsten-containing gas, and $H_2$ or $SiH_4$ gas having a stronger reducing power than that of the $H_2$ gas is used as a reduction gas.

Figure 2A:
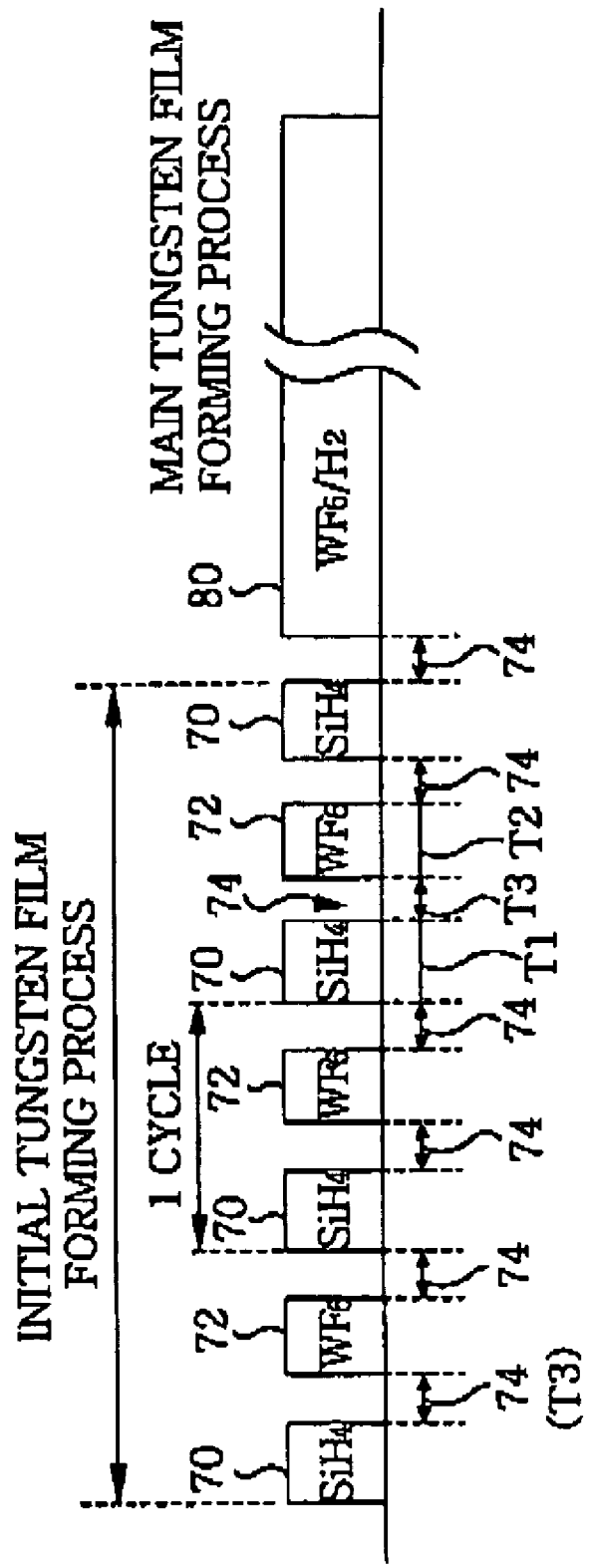
FIG. 2A shows a gas supply pattern wherein a purge process is intervened between a reduction gas supplying process and a tungsten-containing gas supplying process.

A gas supply pattern illustrated in FIG. 2A forms an initial tungsten film 76 (see FIG. 4) by alternately repeating a reduction gas supplying process 70 for supplying a reduction gas, i.e., $SiH_4$ gas and a tungsten-containing gas supplying process 72 for supplying a tungsten gas, i.e., $WF_6$ gas, with a purge process 74, intervened therebetween, for supplying a carrier gas as an inert gas while exhausting in vacuum, intervened therebetween. In other words, an initial tungsten film forming process is carried out by alternately repeating the $SiH_4$ gas supplying process and the $WF_6$ gas supplying process while intervening the purge process 74 therebetween. Such an initial tungsten film forming process is completed by performing the reduction gas supplying process 70. Such a sequence of the processes also apply to cases of FIGS. 2B to 2D.

After the initial tungsten film 76 is formed, a $H_2$ gas instead of the $SiH_4$ gas is used as a reduction gas. Then, by simultaneously supplying the $H_2$ gas and $WF_6$ gas that is a tungsten-containing gas together with an inert gas, e.g., Ar gas or $N_2$ gas, a main tungsten film forming process 80 for forming a main tungsten film 78 is performed, thereby completely filling the buried hole 2 with the main tungsten film 78.

Herein, if a period between a reduction gas supplying process 70 and its next reduction gas supplying process 70 is assumed to be one cycle during the initial tungsten film forming process, three cycles are performed in a case of FIG. 2A. However, the number of cycles is not limited thereto.

A period T1 of each reduction gas supplying process 70 and a period T2 of each tungsten-containing gas supplying process 72 are respectively 1 to 30 seconds and, preferably, 3 to 10 seconds. Further, a period T3 of the purge process 74 is 0 to 30 seconds and, preferably, 0 to 10 seconds. Furthermore, in the purge process 74, only a vacuumizing process may be performed.

Preferably, the total pressure of the reduction gas, the tungsten-containing gas and the inert gas is controlled to be constant throughout the reduction gas supplying processes 70, the tungsten-containing gas supplying processes 72 and the purge processes 74. By maintaining the constant total pressure of the gases, it is possible to uniformly maintain a temperature of the wafer (an object to be processed) and an absorbed amount of gases being absorbed. The total pressure of the gases is controlled by measuring a pressure in the processing vessel 22 by employing the vacuum gauge installed at the processing vessel 22 and controlling the auto pressure control valve installed at the exhaust passageway 50.

In the ensuing discussion, a result of evaluation on the time period of the purge process 74 will be described in detail.

Figure 3A:
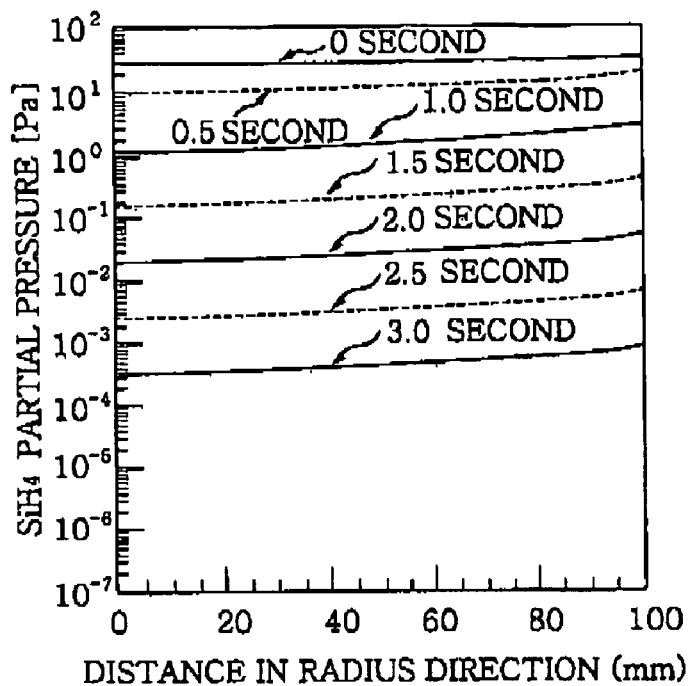
FIG. 3A presents a distribution of a partial pressure of silane ($SiH_4$) in a diffusion processing chamber in case a diffusion plate is installed inside a shower head.
Figure 3B:
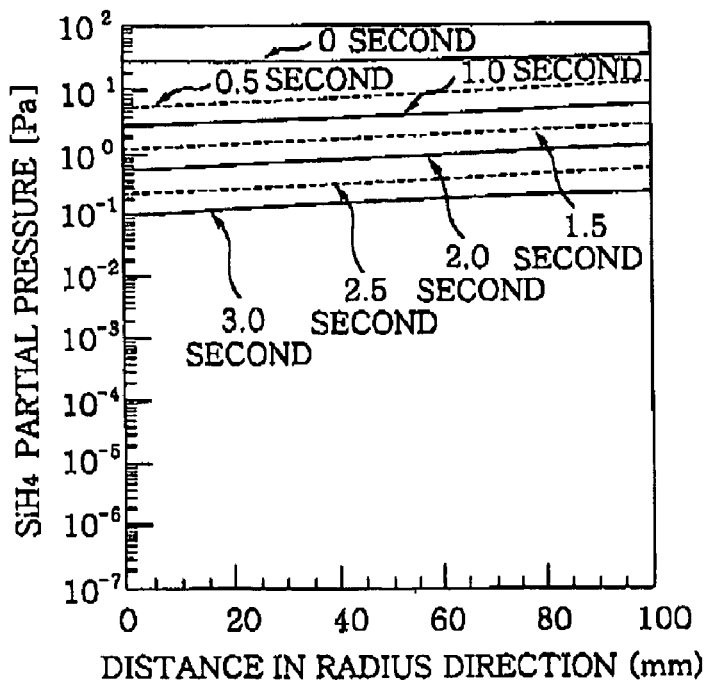
FIG. 3B represents a distribution of a partial pressure of silane ($SiH_4$) in a diffusion processing chamber in case a diffusion plate is not installed inside a shower head.

FIGS. 3A and 3B illustrate a distribution of a partial pressure of silane ($SiH_4$) in the processing vessel 22. FIG. 3A indicates a case where the diffusion plate 27 is installed in the shower head 24 while FIG. 3B represents a case where the diffusion plate 27 is not installed in the shower head 24, wherein the X-axis presents a distance from the center of the wafer in a radius direction. Herein, a partial pressure of the $SiH_4$ remaining on the wafer W was measured when the purge process 74 was performed for a few (0 to 3) seconds right after the $SiH_4$ supply was stopped.

As can be clearly seen from FIGS. 3A and 3B, in case the diffusion plate 27 is installed in the shower head 24 (FIG. 3A), the partial pressure was lowered a little more quickly. That is, in case of FIG. 3A, by performing the purge process 74 for about 1.5 seconds, the partial pressure of $SiH_4$ can be reduced to about $1 \times 10^{-1}$ Pa. Further, in case of FIG. 3B, by performing the purge process 74 for about 3 seconds, the partial pressure of $SiH_4$ can be decreased to about $1 \times 10^{-1}$ Pa.

Therefore, regardless of a structure of the shower head 24, if the purge process 74 is performed for at least about 3 seconds, the partial pressure of the remaining silane can be reduced to about zero, so that it is possible to ignore effects of a gas phase reaction.

Returning to FIG. 2A, partial pressure ratios of the $SiH_4$ gas and the $WF_6$ gas are reduced by relatively decreasing flow rates thereof. Further, a process temperature is set to be, e.g., 200 to 500° C., and, preferably, set to be low at 200 to 450° C. Further, the thickness of an initial tungsten film formed during one cycle is 1 to 50 Å and, preferably, 3 to 20 Å.

A period of the main tungsten film forming process 80 depends on the thickness of a film to be formed. Herein, flow rates of both $WF_6$ gas and $H_2$ gas are increased. Further, a process pressure and a process temperature are also slightly increased, to thereby set a film forming rate to be higher.

By such, the initial tungsten film 76 is substantially uniformly deposited with high quality on the surface of the wafer W. Since the initial tungsten film 76 functions as a nucleation layer 14 shown in FIG. 14C, it is possible to deposit thereon the main tungsten film 78 having satisfactory burying characteristics.

In the gas supply pattern illustrated in FIG. 2B, a parameter (Torr·sec), which is obtained by multiplying a partial pressure (Torr) of the reduction gas by the supplying time (sec) thereof, of an initial reduction gas supplying process 70A is set to be greater than that of the remaining reduction gas supplying process 70 among the repeating reduction gas supplying processes in the gas supply pattern shown in FIG., 2A. Herein, a period T4 of the initial reduction gas supplying process 70A is set to be higher, e.g., 1 to 120 seconds, and, preferably, 30 to 90 second, without changing a flow rate of the SiH$_4$ gas, to increase the parameter (Torr·sec).

Figure 14B:
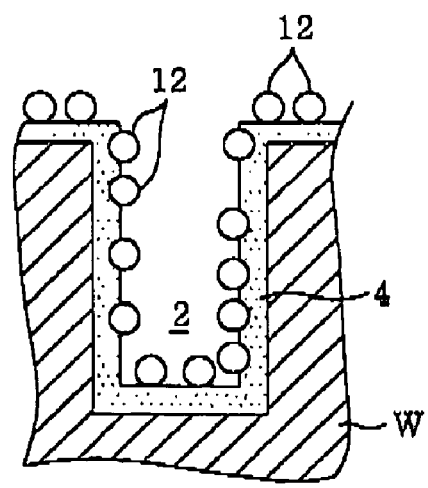
FIG. 14B offers an embodiment of a process for filling with tungsten the buried hole formed on the wafer W to which reaction intermediates, i.e., SiHx, are adhered.
Figure 14C:
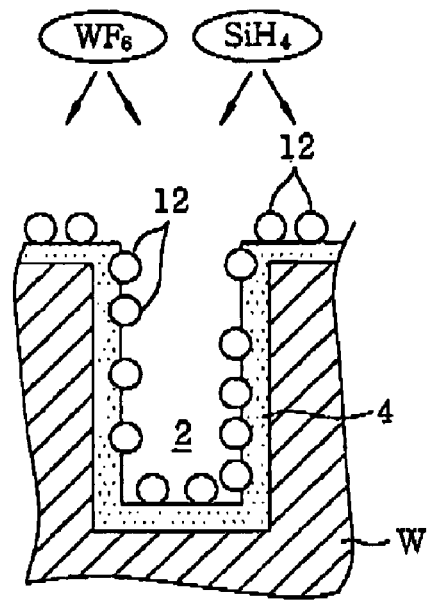
FIG. 14C presents an embodiment of a process for filling with tungsten the buried hole formed on the wafer W wherein a nucleation layer is deposited starting from the reaction intermediates.
Figure 14D:
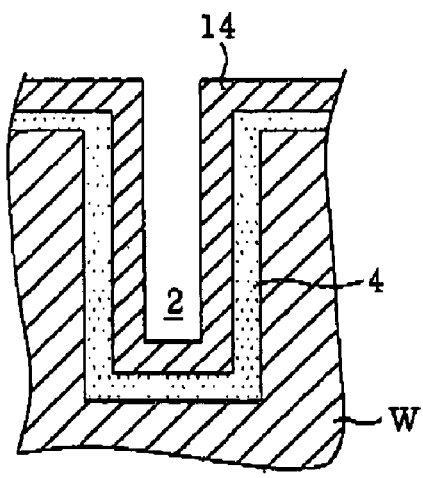
FIG. 14D represents an embodiment of a process for filling with tungsten the buried hole formed on the wafer W having the nucleation layer formed thereon.
Figure 14E:
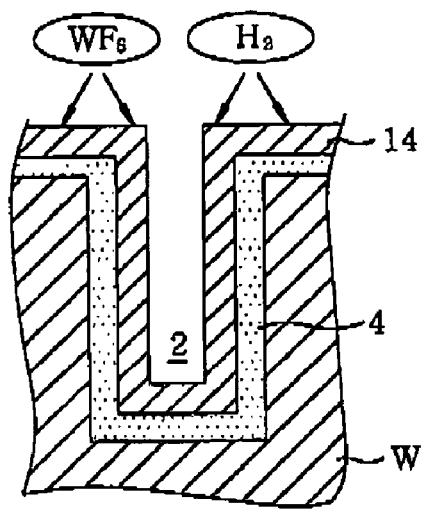
FIG. 14E shows an embodiment of a process for filling with tungsten the buried hole on the wafer W having the nucleation layer formed thereon by supplying a reduction gas and a tungsten-containing gas.
Figure 14F:
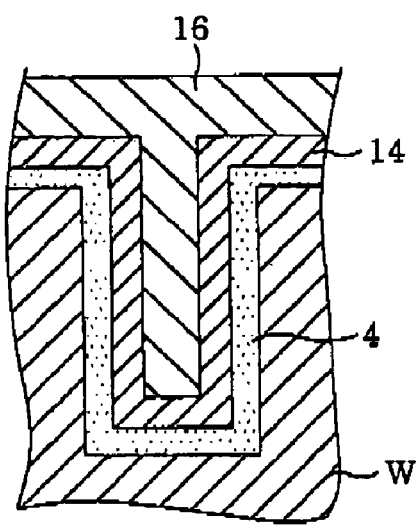
FIG. 14F sets forth an embodiment of a process for filling with tungsten the buried hole formed on the wafer W having a main tungsten film formed thereon.

In this way, by performing only an initial SiH$_4$ gas supplying process for a long time, an initiation process is performed on the wafer W surface, so that the reaction intermediates, i.e., SiH$_x$, can be adhered thereon as described with reference to FIG. 14B. Accordingly, it is possible to form a tungsten film 76 having a thickness of an improved uniformity.

Figure 2C:
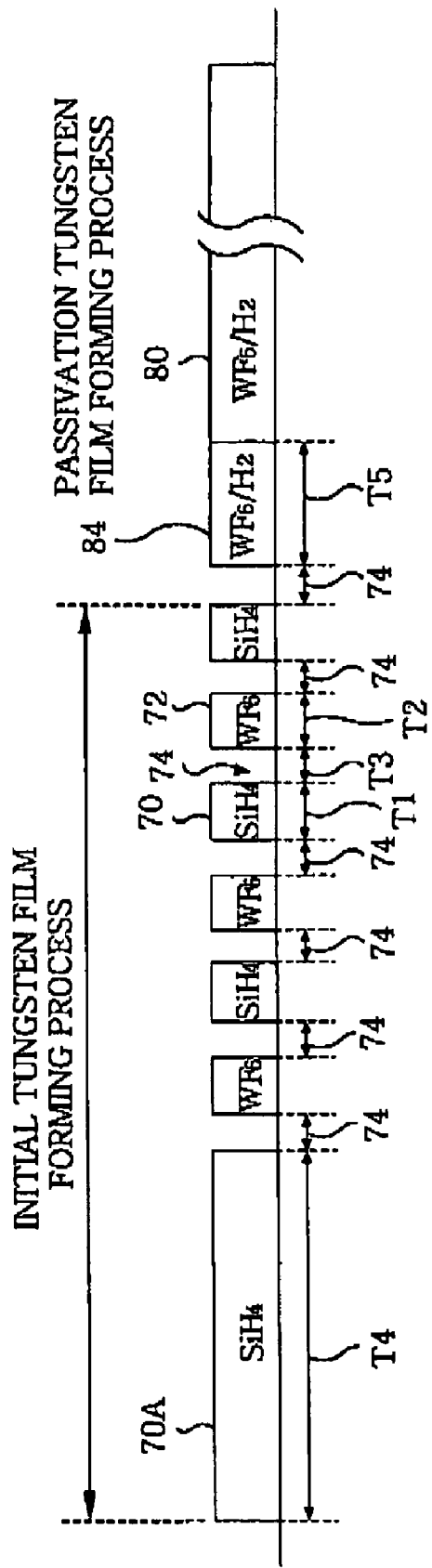
FIG. 2C describes a gas supply pattern wherein a passivation tungsten film forming process is intervened between an initial tungsten film forming process and a main tungsten film forming process in the gas supply pattern of FIG. 2B.

Further, in the gas supply pattern shown in FIG. 2C, the passivation tungsten film forming process 84 for forming a passivation tungsten film 82 (see FIG. 5) is performed right before the main tungsten film forming process 80 in the gas supply pattern illustrated in FIG. 2B. In the passivation tungsten film forming process 84, gas species, i.e., WF$_6$ gas and H$_2$ gas, used in the main tungsten film forming process 80 are used. However, the flow ratio of a tungsten-containing gas is set to be smaller than that of S the main tungsten film forming process 80. A period T5 of the passivation tungsten film forming process 84 is, e.g., 3 to 90 seconds and, preferably, 10 to 60 seconds.

In the gas supply pattern shown in FIG. 2D, the passivation tungsten film forming process 84 is successively performed right before the main tungsten film forming process 80 in the gas supply pattern illustrated in FIG. 2A.

Since the passivation tungsten film functions as a so-called passivation film, a damage of a Ti film due to a diffusion of F of WF$_6$ can be prevented in the main tungsten film forming process, thereby further improving the burying characteristics.

Hereinafter, each process condition in the gas supply pattern of FIG. 2C will be described. In the initial reduction gas supplying process 70A, a gas ratio of SiH$_4$ to a carrier gas is 90 sccm/8550 sccm, a process pressure is 80 Torr (10640 Pa) and a processing period T4 is 60 seconds. A maximum value of a process temperature is 200 to 500° C. and, preferably, 250 to 450° C., so as to avoid volcanoes or improve a step coverage.

Further, in this process, the parameter (Torr·sec), which is obtained by multiplying the partial pressure of SiH$_4$ gas by a supply time thereof, is set to 10 to 300 Torr·sec and, preferably, 30 to 200 Torr·sec in order to avoid volcanoes.

In the initial tungsten forming process, a gas ratio of SiH$_4$ to the carrier gas in a second and its subsequent reduction gas supplying processes 70 is 90 sccm/3900 sccm, a period T1 thereof is 5 seconds and a process pressure is 7.5 Torr (998 Pa). A process temperature is 200 to 500° C. and, preferably, 250 to 450° C. At this time, the parameter is 0.1 to 10 Torr·sec and, preferably, 0.2 to 5 Torr·sec for the purpose of saturating the film thickness.

Further, in the tungsten-containing gas forming process 72, a gas ratio of WF$_6$ to a carrier gas is 30 sccm/3900 sccm, a period T2 thereof is 5 seconds and a process pressure is 7.5 Torr (998 Pa). A process temperature is 200 to 500° C. and, preferably, 250 to 450° C. At this time, the parameter (the partial pressure×the supplying time of the WF$_6$ gas) is set to 0.01 to 0.6 Torr·sec and, preferably, 0.04 to 0.5 Torr·sec in order to saturate the film thickness, thereby avoiding volcanoes.

Figure 6:
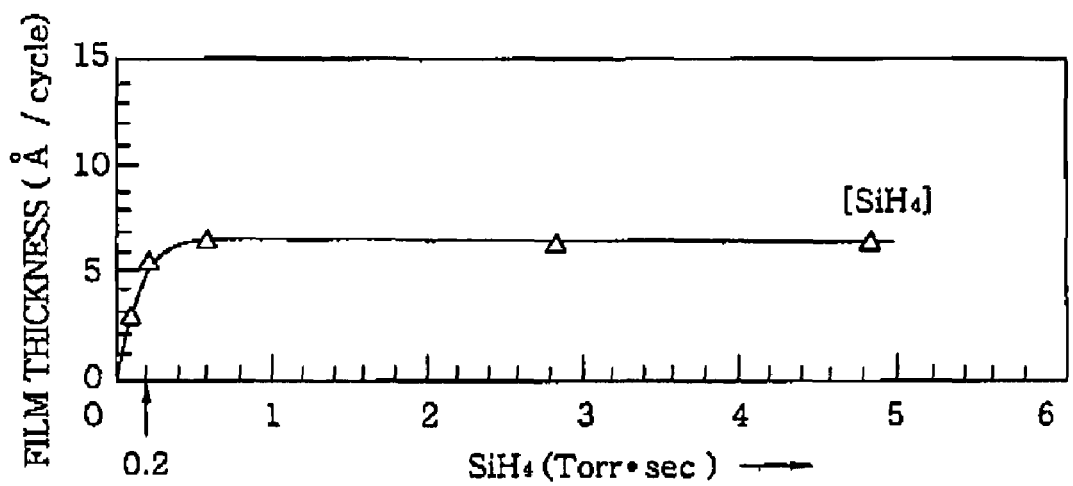
FIG. 6 is a graph showing a relationship between a parameter (Torr·sec) of silane gas and the thickness of a film formed during one cycle.

In the following, a detailed description of the reduction gas supplying process 70 and the tungsten-containing gas supplying process 72 will be given. FIG. 6 provides a graph showing a relationship between the parameter (Torr·sec) of silane at about 280° C. and the thickness of a film formed during one cycle. In case the parameter is greater than or equal to 0.2, the film thickness is approximately saturated. On the other hand, in case the parameter is smaller than 0.2, the film thickness depends on a value of the parameter. That is, in order to form the initial tungsten film 76 having a predetermined thickness, the parameter is set to be 0.1 to 10 and, preferably, 0.2 to 5 to stabilize, e.g., in terms of its quality and uniformity, the thickness of the film formed during one cycle. As a result, it is possible to saturate and stabilize, e.g., in terms of its quality and uniformity, the film thickness under various process conditions.

Figure 7:
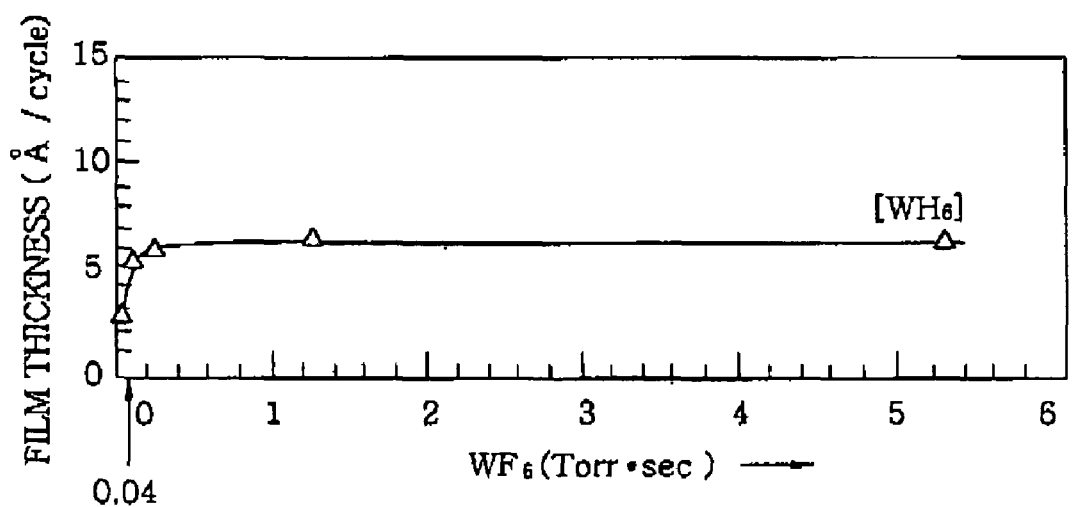
FIG. 7 provides a graph illustrating a relationship between a parameter (Torr·sec) of $WF_6$ and the thickness of a film formed during one cycle.

FIG. 7 offers a graph illustrating a relationship between the parameter (Torr·sec) of WF$_6$ at about 280° C. and the thickness of a film formed during one cycle, In case the parameter is greater than or equal to 0.04, the film thickness is approximately saturated. On the other hand, if the parameter is smaller than 0.04, the film thickness depends on a value of the parameter. That is, as described above, in order to stabilize, e.g., in terms of its quality and uniformity, the thickness of the film formed during one cycle, the parameter is set to be 0.01 to 10 and, preferably, 0.04 to 5.

Figure 8:
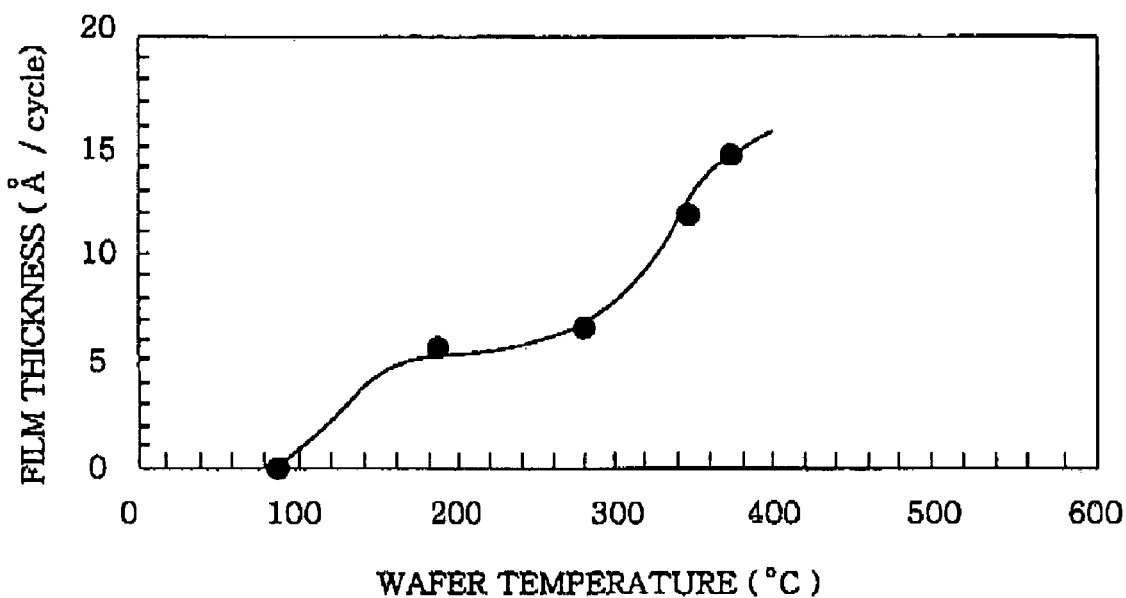
FIG. 8 describes a graph depicting a temperature dependency of the thickness of a film formed during one cycle of a gas supply.

FIG. 8 presents a graph showing a temperature independency of the thickness of a film formed during one cycle of a gas supply. In FIG. 8, there is illustrated the film thickness per one cycle when SiH$_4$ and WF$_6$ are alternately supplied 90 times (90 cycles). In the graph, the X-axis indicates an actual wafer temperature.

As can be clearly seen from the graph, in case the wafer temperature is lower than or equal to 100° C., the film is not deposited on the wafer. From 200 to 300° C., a film forming rate is gradually increased with the increase of temperature. Then, at 300° C. and above, it is clear that the film forming rate is rapidly increased. Therefore, it is preferable to set the water temperature (being slightly lower than a process temperature) to be greater than same to 100° C. in view of the film thickness.

Figure 9:
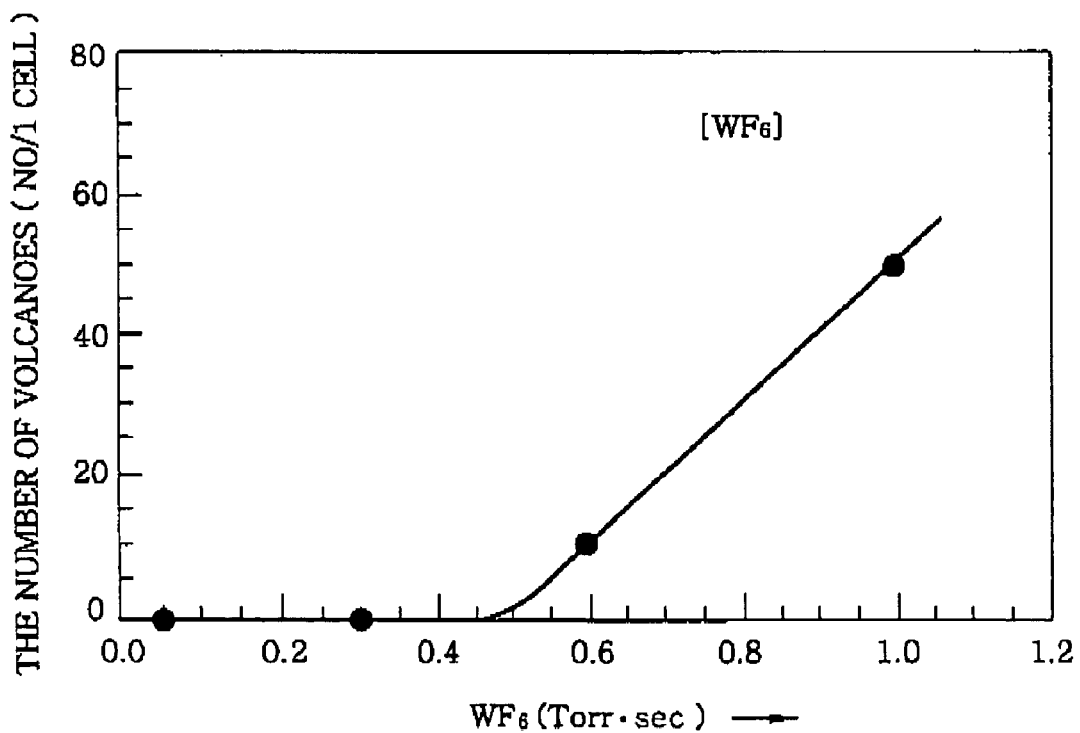
FIG. 9 illustrates a graph showing a relationship between a parameter (Torr·sec) of $WF_6$ and the number of volcanoes generated in one cell.

FIG. 9 depicts a graph illustrating a relationship between the parameter (Torr·sec) of WF$_6$ gas and the number of volcanoes generated in one cell. Herein, one cell indicates a group including therein about 50,000 contact holes. According to the graph, in case the parameter is smaller than or same to 0.5, volcanoes are not generated. However, if the parameter is greater than 0.5, the number of generated volcanoes is increased substantially linearly. Under various process conditions, the parameter of the WF$_6$ gas is 0.01 to 0.6 and, preferably, 0.04 to 0.5. The thickness of the initial tungsten film 76, which may be affected by an inner diameter of the buried hole 2, is, e.g., 10 to 200 Å and, preferably, 20 to 150 Å.

Next, in the passivation tungsten film forming process 84, a gas ratio of WF$_6$ gas, H$_2$ gas and a carrier gas is deposit thereon the main tungsten film 78 having satisfactory burying characteristics.

In the gas supply pattern illustrated in FIG. 2B, a parameter (Torr·sec), which is obtained by multiplying a partial pressure (Torr) of the reduction gas by the supplying time (sec) thereof, of an initial reduction gas supplying process 70A is set to be greater than that of the remaining reduction gas supplying process 70 among the repeating reduction gas supplying processes in the gas supply pattern shown in FIG. 2A. Herein, a period T4 of the initial reduction gas supplying process 70A is set to be higher, e.g., 1 to 120 seconds, and, preferably, 30 to 90 second, without changing a flow rate of the SiH$_4$ gas, to increase the parameter (Torr·sec).

In this way, by performing only an initial SiH$_4$ gas supplying process for a long time, an initiation process is performed on the wafer W surface, so that the reaction intermediates, i.e., SiH$_x$, can be adhered thereon as described with reference to FIG. 14B. Accordingly, it is possible to form a tungsten film 76 having a thickness of an improved uniformity.

Further, in the gas supply pattern shown in FIG. 2C, the passivation tungsten film forming process 84 for forming a passivation tungsten film 82 (see FIG. 5) is performed right before the main tungsten film forming process 80 in the gas supply pattern illustrated in FIG. 2B. In the volcanoes and obtain somewhat high step coverage and film forming rate at the same time. In this process, a process pressure is 40 Torr (5320 Pa) and a process temperature is 300 to 500° C. and, preferably, 350 to 450° C. In this case, the process pressure is set to be within a range of 20 to 200 Torr (2660 to 26600 Pa) in order to avoid the generation of volcanoes. Further, a maximum value of the process temperature is 300 to 500° C. and, preferably, 350 to 450° C., thereby avoiding the generation of volcanoes and somewhat high step coverage and the film forming rate.

With respect to the partial pressure of the $WF_6$ gas, a minimum value thereof is about 0.4 Torr (53 Pa) so as to increase the step coverage to a certain degree while a maximum value thereof is about 2.0 Torr (266 Pa) in order to avoid the generation of volcanoes under the process pressure of smaller than or equal to 40 Torr. Moreover, a gas ratio of $WF_6$ to $H_2$ is set to be 0.01 to 1 and, preferably, 0.1 to 0.5, to thereby increase the step coverage to a certain degree and avoid the generation of volcanoes.

In addition, at least either the process pressure or the process temperature of the main tungsten film forming process 80 is set to be substantially higher, in comparison with the passivation tungsten film forming process 84. In this way, the film forming rate of the main tungsten film forming process 80 is increased. Especially, it is preferable to form a tungsten film during a transition between the processes, so that a speed of forming the tungsten film can be increased, the process temperature being increased from 350° C. to 400° C. during the transition in the exemplary case described herein.

Figure 10B:
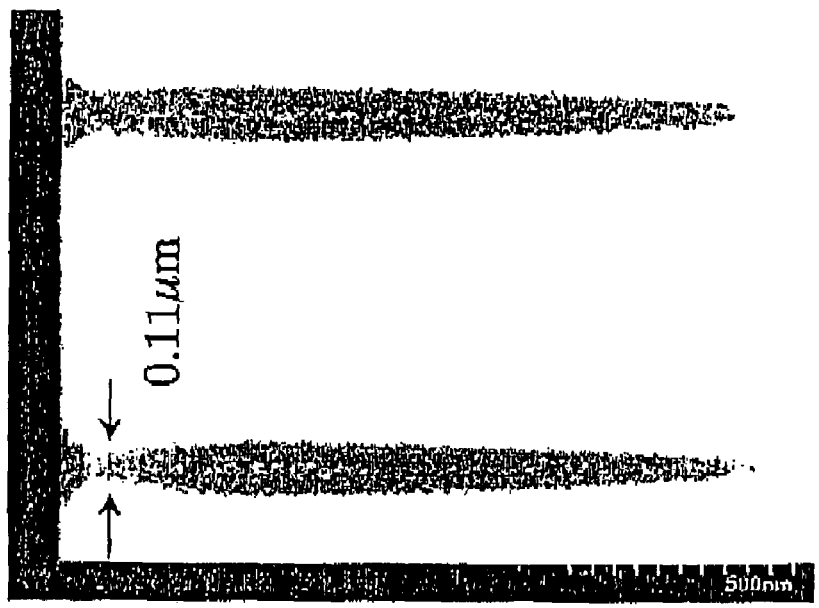
FIG. 10B represents a picture substituting a diagram showing a cross sectional view of a buried hole buried by using a method of the present invention.
Figure 10A:
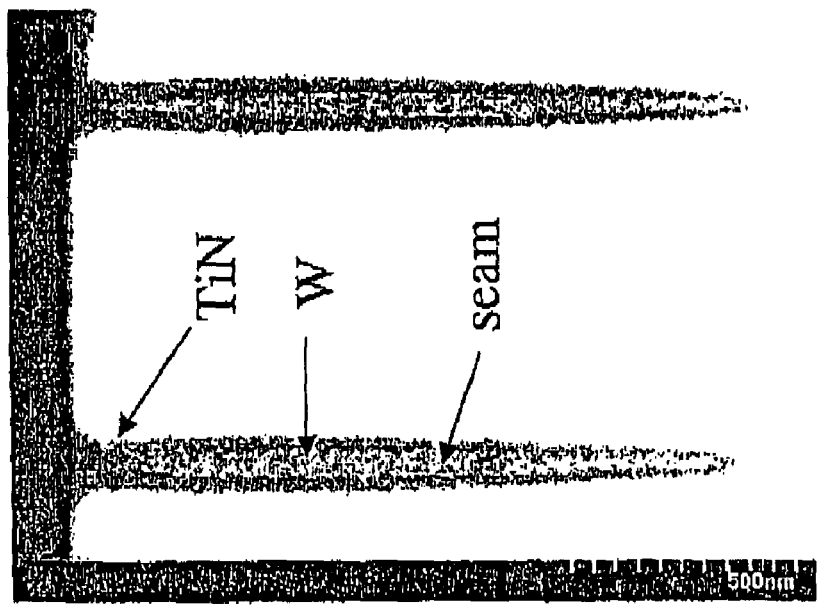
FIG. 10A presents a picture substituting a diagram showing a cross sectional view of a buried hole buried by using a conventional method.

After the burial was actually performed by using the method of the present invention as shown in FIG. 2C, results illustrated in FIGS. 10A and 10B were obtained.

FIGS. 10A and 10B respectively provide pictures of cross sectional views of buried holes that are buried by using a conventional method and the method of the present invention. In case of the conventional method shown in FIG. 10A, an unsatisfactory result was obtained due to a void generated in the buried hole. On the other hand, in case of the method of the present invention illustrated in FIG. 10B, no void was not generated in the buried hole, obtaining satisfactory burying characteristics. In this case, an inner diameter of the buried hole was 0.13 μm. Thus, in case of a minute hole greater than or equal to 0.13 μm, the method of the present invention is effective. Besides, satisfactory effects were also obtained in case of a minute hole smaller than or equal to 0.13 μm.

After forming a tungsten film having a thickness ranging from 100 Å to 300 Å, a surface roughness thereof was examined by an electron microscope. In case the tungsten film is formed by employing a conventional CVD method, the surface roughness of the film was increased as the film thickness was increased from 100 Å to 300 Å. However, in case of the method of the present invention, it has been proven that the surface roughness of the, film is nearly stable regardless of the film thickness and that a smooth surface of the tungsten film is provided.

Resistivity measurement was also carried out on the tungsten films described above and the evaluation result thereof will be described with reference to FIG. 11.

Figure 11:
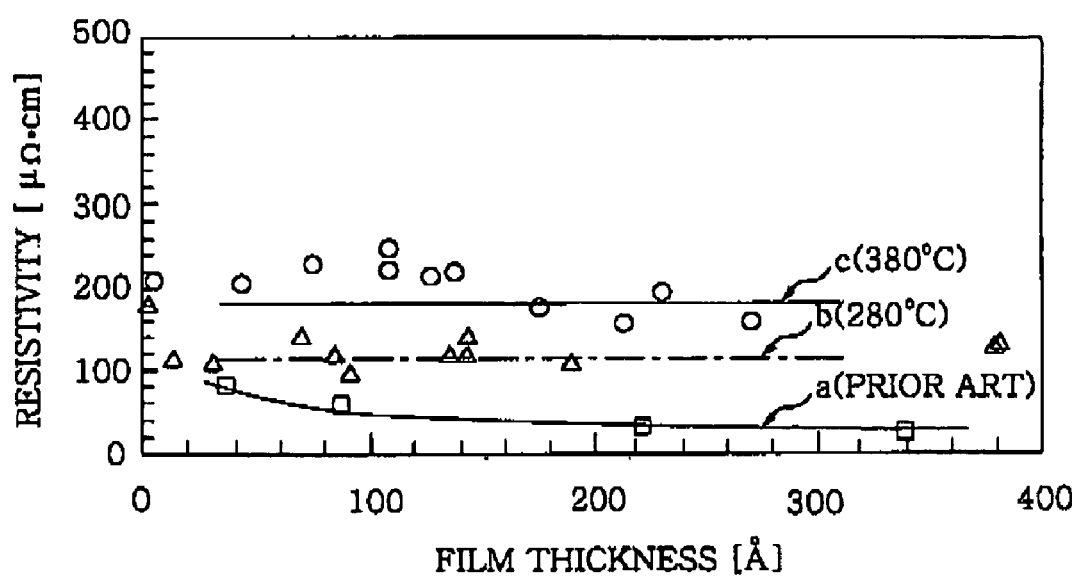
FIG. 11 shows a graph depicting a temperature dependency of a resistivity of a tungsten film.

FIG. 11 depicts a graph showing a temperature independency of resistivities of tungsten films. In the graph, (a) indicates a tungsten film formed by employing the conventional CVD method (a process temperature ≈400° C.); (b) represents a tungsten film formed at a process temperature of 280° C. by using the method of the present invention; and (c) depicts a tungsten film formed at the process temperature of 380° C. by using the method of the present invention.

As can be clearly seen from the graph, the films (b) and (c) formed by using the method of the present invention have an about twice to four times greater resistivities than that of the film (a) formed by using the conventional CVD method. This is because the films (b) and (c) have a twice to tour times smaller microcrystalline size than that of the film (a). Further, between the films (b) and (c) formed by the method of the present invention, a film formed at a higher temperature has a greater resistivity. This is to be believed because the film formed at the higher temperature contains Si of high concentration.

Furthermore, a result of examining a concentration of fluorine (F) diffused on a wafer surface will be described.

Figure 12:
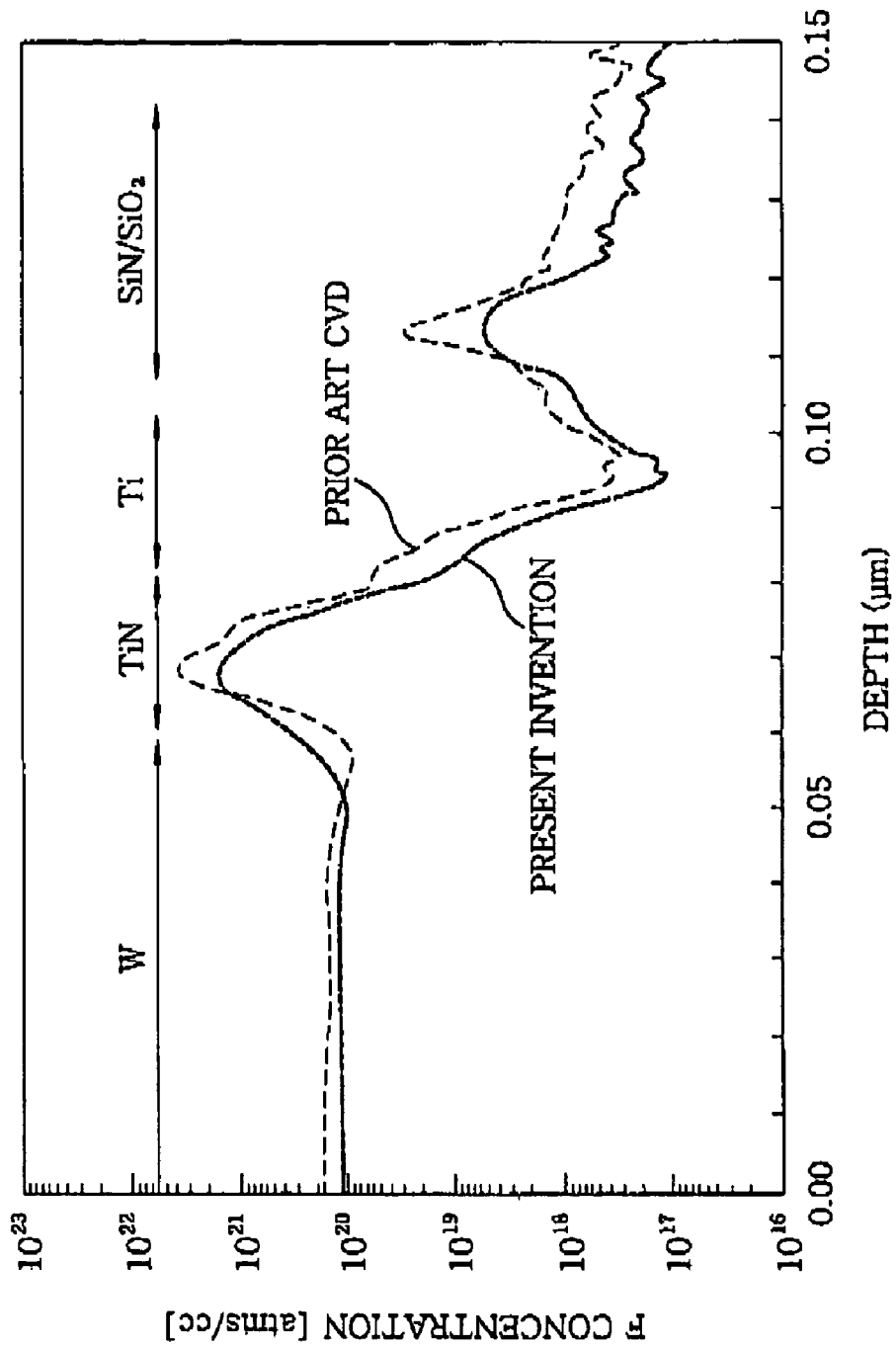
FIG. 12 provides a graph illustrating a fluorine F concentration (the amount of diffusion) profile of a wafer surface.
Figure 13:
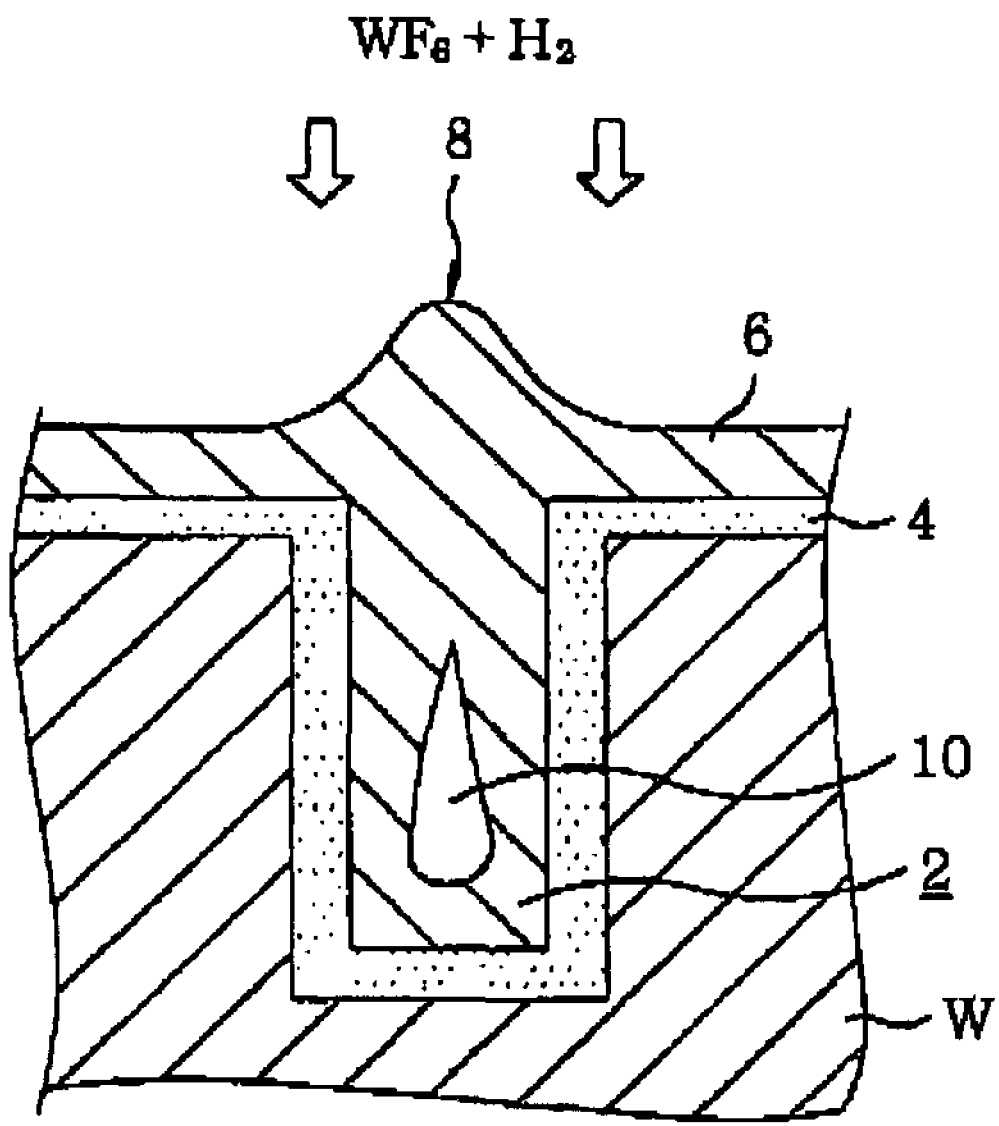
FIG. 13 describes a cross sectional view of a buried hole with a volcano and a void generated.

FIG. 12 illustrates a graph showing a profile of F concentration (an amount of diffusion) on the wafer surface. A wafer used herein has a TiN film, a Ti film, and an $SiO_2$ film that are sequentially formed under the W film (tungsten film).

As can be clearly seen from the graph, the F concentration of the Ti film formed in accordance with the method of the present invention B is $1 \times 10^{17}$ atms/cc while the F concentration of the Ti film formed by the conventional CVD method A is $3 \times 10^{17}$ atms/cc. In other words, the amount of F diffusion in the Ti film formed in accordance with the present invention B is suppressed at about one third of that formed in the conventional CVD method A, which represents higher barrier characteristics.

Though hydrogen and silane were used as a reduction gas in the above preferred embodiment, disilane ($Si_2H_6$), dichororosilane ($SiH_2Cl_2$), diborane ($B_2H_6$), phosphine ($PH_3$) or a mixture thereof can also be used. In this case, it is preferable to use a gas having a stronger reducing power in the initial tungsten film forming process than in the main tungsten film forming process 80.

Further, a same reduction gas may be used in the initial tungsten film forming process, the passivation tungsten film forming process and the main tungsten film forming process.

Although $SiH_4$ was used in the initial tungsten film forming process, an H radical (an active species) generated by using plasma or ultraviolet light may be used.

As the tungsten-containing gas, $WF_6$ gas was used but an organic tungsten source gas may also be used.

In this preferred embodiment, a wafer was described as an object to be processed. However, the present invention is not limited thereto but may be applied to an LCD substrate, a glass substrate and the like.

As described above, the method of forming a tungsten film in accordance with the present invention can provide the following advantageous operative effects.

In accordance with the present invention, an initial tungsten film can be formed as a nucleation layer having high film thickness uniformity. Therefore, when a main tungsten film is subsequently deposited thereon, even if a diameter of a buried hole is small for example, it is possible to avoid the generation of voids or volcanoes as large as those that can adversely affect the burying characteristics.

Further, since the present invention provides a substantially same function as an initiation process of the conventional method, reaction intermediates can be adhered to a surface of an object to be processed, so that the surface can be activated.

Furthermore, in accordance with the present invention, even in case a semiconductor device becomes miniaturized, e.g., if a diameter of a buried hole is smaller than or equal to 0.1 μm, it is possible to avoid the generation of voids and volcanoes having sizes as large as those which can adversely affect the burying characteristics.

Moreover, in accordance with the present invention, singe the passivation tungsten film functions as a so-called passivation film, it is possible to further improve the burying characteristics.

While the invention has been shown and described with respect to the preferred embodiments, it will be understood by those skilled in the art that various changes and modifications may be made without departing from the spirit and scope of the invention as defined in the following claims.

What is claimed as:

1. A method of forming a tungsten film on a surface of an object to be processed in a vessel capable of being vacuumized, the method comprising:
    forming a tungsten film by alternately repeating a reduction gas supplying process for supplying a reduction gas to the vessel and a tungsten gas supplying process for supplying a tungsten-containing gas to the vessel with an intervening purge process therebetween for supplying an inert gas to the vessel while exhausting the vessel,
    wherein the tungsten film is formed by alternately repeating the reduction gas supplying process for supplying the reduction gas to the vessel and the tungsten gas supplying process for supplying the tungsten-containing gas to the vessel while controlling the total pressure of the gases to be constant in the vessel throughout the step of forming the tungsten film, and
    wherein a reduction gas-supplying period of an initial reduction gas supplying process among the repeated reduction gas supplying processes for supplying a reduction gas to the vessel is set to be longer than that of the remaining reduction gas supplying processes for supplying a reduction gas to the vessel.

2. The method of claim 1, wherein a parameter, which is obtained by multiplying a partial pressure of the reduction gas by the supplying period thereof in the initial reduction gas supplying process among the repeated reduction gas supplying processes, is set to be greater than that in the remaining reduction gas supplying processes.

3. The method of claim 1, wherein the tungsten-containing gas is $WF_6$ gas or an orgarnc tungsten source gas.

4. The method of claim 1, wherein the reduction gas is selected from the group consisting of $H_2$ gas, silane ($SiH_4$), disilane ($Si_2H_6$), dichlororosilane ($SiH_2Cl_2$), diborane ($B_2H_6$) and phospine ($PH_3$).

5. A method of forming a tungsten film on a surface of an object to be processed in a vacuum vessel, the method comprising the steps of:
    forming an initial tungsten film by alternately repeating a reduction gas supplying process for supplying a reduction gas to the vessel and a tungsten gas supplying process for supplying a tungsten-containing gas to the vessel with an intervening purge process therebetween for supplying an inert gas to the vessel while exhausting the vessel; and,
    forming a main tungsten film on the initial tungsten film by simultaneously supplying the tungsten-containing gas and the reduction gas to the vessel after the initial tungsten film is formed,
    wherein during the step of forming the initial tungsten film, the initial tungsten film is formed by alternately repeating the reduction gas supplying process for supplying the reduction gas to the vessel and the tungsten gas supplying process for supplying the tungsten-containing gas to the vessel while controlling the total pressure of the gases to be constant throughout the step of forming the initial tungsten film, and
    wherein during the step of forming the initial tungsten film, a reduction gas supplying period of an initial reduction gas supplying process among the repeated reduction gas supplying processes for supplying a reduction gas to the vessel is set to be longer than that of the remaining reduction gas supplying processes for supplying a reduction gas to the vessel.

6. The method of claim 5, wherein during the step of forming the initial tungsten film, a parameter, which is obtained by multiplying a partial pressure of the reduction gas by the supplying period thereof in an initial reduction gas supplying process among the repeated reduction gas supplying processes is set to be greater than that in the remaining reduction gas supplying processes.

7. The method of claim 5, wherein the tungsten-containing gas is $WF_6$ gas or an organic tungsten source gas.

8. The method of claim 5, wherein the reduction gas is selected from the group consisting of $H_2$ gas, silane ($SiH_4$), disilane ($Si_2H_6$), dichlororosilane ($SiH_2Cl_2$), diborane ($B_2H_6$) and phospine ($PH_3$).

9. A method of forming a tungsten film on a surface of an object to be processed in a vacuum vessel, the method comprising the steps of:
    forming an initial tungsten film by alternately repeating a reduction gas supplying process for supplying a reduction gas to the vessel and a tungsten gas supplying process for supplying a tungsten-containing gas to the vessel with an intervening purge process therebetween for supplying an inert gas to the vessel while exhausting the vessel;
    forming a passivation tungsten film on the initial tungsten film by supplying the tungsten-containing gas and the reduction gas to the vessel; and
    forming a main tungsten film on the passivation tungsten film by simultaneously supplying the tungsten-containing gas and the reduction gas to the vessel,
    wherein the passivation tungsten film is formed by simultaneously supplying the tungsten-containing gas and the reduction gas to the vessel while controlling a flow ratio of the tungsten-containing gas to be smaller than that in the main tungsten film forming step, and wherein during the step of forming the initial tungsten film, the initial tungsten film is formed by alternately repeating the reduction gas supplying process for supplying the reduction gas to the vessel and the tungsten gas supplying process for supplying the tungsten-containing gas to the vessel while controlling the total pressure of the gases to be constant throughout the step of forming the initial tungsten film, and
    wherein during the step of forming the initial tungsten film, a reduction gas supplying period of an initial reduction gas supplying process among the repeated reduction gas supplying processes for supplying a reduction gas to the vessel is set to be longer than that of the remaining reduction gas supplying processes for supplying a reduction gas to the vessel.

10. The method of claim 9, wherein during the step of forming the initial tungsten film, a parameter, which is obtained by multiplying a partial pressure of the reduction gas by the supplying period thereof, in the initial reduction gas supplying process among the repeated reduction gas supplying processes is set to be greater than that in the remaining reduction gas supplying processes.

11. The method of claim 9, wherein the initial tungsten film forming step and the passivation tungsten film forming step have at least either a process pressure or a process temperature substantially equal.

12. The method of claim 9, wherein the main tungsten film forming step has at least either a process pressure or a process temperature substantially higher than the passivation tungsten film forming step.

13. The method of claim 9, wherein the tungsten-containing gas is $WF_6$ gas or an organic tungsten source gas.

14. The method of claim 9, wherein the reduction gas is selected from the group consisting of $H_2$ gas, silane ($SiH_4$), disilane ($Si_2H_6$), dichlororosilane ($SiH_2Cl_2$), diborane ($B_2H_6$) and phospine ($PH_3$).

15. The method of claim 9, wherein, in the initial tungsten film forming step, the tungsten-containing gas is $WF_6$ gas, and the reduction gas includes $SiH_4$ gas, and
wherein, in the passivation tungsten film forming step, the tungsten-containing gas is $WF_6$ gas and the reduction gas includes $H_2$ gas.

16. A method of forming a tungsten film on a surface of an object to be processed in a vacuum vessel, the method comprising the steps of:
forming a tungsten film by alternately repeating a reduction gas supplying process for supplying a reduction gas to the vessel and a tungsten gas supplying process for supplying a tungsten-containing gas to the vessel with an intervening purge process therebetween for supplying an inert gas to the vessel while exhausting the vessel; and
wherein forming the tungsten film is completed by performing the reduction gas supplying process, and
wherein during the step of forming the tungsten film, the tungsten film is formed by alternately repeating the reduction gas supplying process for supplying a reduction gas to the vessel and the tungsten gas supplying process for supplying a tungsten containing gas to the vessel while controlling the total pressure of the gases to be constant throughout the step of forming the tungsten film, and
wherein during the step of forming the tungsten film, a reduction gas supplying period of a reduction gas supplying process among the repeated reduction gas supplying processes for supplying a reduction gas to the vessel is set to be longer than that of the remaining reduction gas supplying processes for supplying a reduction gas to the vessel.

17. The method of claim 16, wherein during the step of forming the tungsten film, a parameter, which is obtained by multiplying a partial pressure of the reduction gas by the supplying period thereof in a reduction gas supplying process among the repeated reduction gas supplying processes is set to be greater than that in the remaining reduction gas supplying processes.

18. The method of claim 16, wherein the tungsten-containing gas is $WF_6$ gas or an organic tungsten source gas.

19. The method of claim 16, wherein the reduction gas is selected from the group consisting of $H_2$ gas, silane ($SiH_4$), disilane ($Si_2H_6$), dichlororosilane ($SiH_2Cl_2$), diborane ($B_2H_6$) and phospine ($PH_3$).

20. The method of claim 1, wherein a TiN film is formed on the surface of the object, and
wherein the tungsten film is formed on the TiN film.

21. The method of claim 5, wherein a TiN film is formed on the surface of the object, and
wherein the initial tungsten film is formed on the TiN film.

22. The method of claim 9, wherein a TiN film is formed on the surface of the object, and
wherein the initial tungsten film is formed on the TiN film.

23. The method of claim 2, wherein the parameter is about 10 to 300 Torr·sec.

24. The method of claim 6, wherein the parameter is about 10 to 300 Torr·sec.

25. The method of claim 10, wherein the parameter is about 10 to 300 Torr·sec.

26. The method of claim 1, wherein the method is performed in a temperature ranging from about 200 to 500° C.

27. The method of claim 5, wherein the method is performed in a temperature ranging from about 200 to 500° C.

28. The method of claim 9, wherein the method is performed in a temperature ranging from about 200 to 500° C.

29. The method of claim 5, wherein the initial tungsten film is formed by supplying $WF_6$ gas as the tungsten-containing gas and $SiH_4$ gas as the reduction gas, and
wherein the main tungsten film is formed on the initial tungsten film by supplying $WF_6$ gas as the tungsten-containing gas and $H_2$ gas as the reduction gas.

30. The method of claim 1, wherein, in the tungsten film forming step, the tungsten-containing gas is $WF_6$ gas and the reduction gas includes $SiH_4$ gas.

31. The method of claim 16, wherein, in the tungsten film forming step, the tungsten-containing gas is $WF_6$ gas and the reduction gas includes $SiH_4$ gas.

32. The method of claim 16, wherein a TiN film is formed on the surface of the object, and
wherein the tungsten film is formed on the TiN film.

* * * * *

UNITED STATES PATENT AND TRADEMARK OFFICE
CERTIFICATE OF CORRECTION

PATENT NO.        : 7,592,256 B2
APPLICATION NO.   : 10/486794
DATED             : September 22, 2009
INVENTOR(S)       : Okubo et al.

Page 1 of 1

It is certified that error appears in the above-identified patent and that said Letters Patent is hereby corrected as shown below:

On the title page, Item (75) should read:
-- (75)  Inventors: Kazuya Okubo, Tokyo (JP); Mitsuhiro Tachibana, Yamanashi (JP); Cheng Fang, Yamanashi (JP); Kenji Suzuki, Yamanashi (JP); Kohichi Satoh, Yamanashi (JP); Hotaka Ishizuka, Yamanashi (JP) --

Signed and Sealed this

Tenth Day of November, 2009

David J. Kappos
*Director of the United States Patent and Trademark Office*